(12) United States Patent
Shui et al.

(10) Patent No.: US 11,831,184 B2
(45) Date of Patent: Nov. 28, 2023

(54) METHOD AND DEVICE FOR ACQUIRING CHARGING ELECTRICITY AMOUNT, AND ELECTRONIC DEVICE

(71) Applicant: Sungrow Power Supply Co., Ltd., Hefei (CN)

(72) Inventors: Xingfeng Shui, Hefei (CN); Zijiao Pan, Hefei (CN); Peng Zhang, Hefei (CN); Laibao Li, Hefei (CN)

(73) Assignee: Sungrow Power Supply Co., Ltd., Hefei (CN)

( * ) Notice: Subject to any disclaimer, the term of this patent is extended or adjusted under 35 U.S.C. 154(b) by 0 days.

(21) Appl. No.: 17/718,718

(22) Filed: Apr. 12, 2022

(65) Prior Publication Data
US 2022/0360095 A1 Nov. 10, 2022

(30) Foreign Application Priority Data
May 8, 2021 (CN) .......................... 202110499576.7

(51) Int. Cl.
*G01R 31/00* (2006.01)
*H02J 7/00* (2006.01)
(Continued)

(52) U.S. Cl.
CPC ........ *H02J 7/00032* (2020.01); *B60L 53/665* (2019.02); *G01R 22/068* (2013.01); *G06Q 50/06* (2013.01); *H02J 7/0047* (2013.01)

(58) Field of Classification Search
CPC .................................................. H02J 7/00032
(Continued)

(56) References Cited

U.S. PATENT DOCUMENTS

| 5,297,664 A | 3/1994 | Tseng et al. |
| 2011/0285345 A1* | 11/2011 | Kawai .................... B60L 53/11 |
| | | 320/107 |
| 2020/0164859 A1* | 5/2020 | Books .................. B60W 10/06 |

FOREIGN PATENT DOCUMENTS

| CN | 101834464 A | 9/2010 |
| CN | 107105446 A | 8/2017 |

(Continued)

OTHER PUBLICATIONS

First Office Action for Chinese Application No. 202110499576.7, dated Jan. 6, 2023.
(Continued)

*Primary Examiner* — Vincent Q Nguyen
(74) *Attorney, Agent, or Firm* — Wolf, Greenfield & Sacks, P.C.

(57) ABSTRACT

A method and a device for acquiring a charging electricity amount, and an electronic device are provided. When a controller determines based on at least operation state information of an external electric meter that the external electric meter is in a fault state, the first amount of electricity, outputted by the charging pile when the external electric meter is in the fault state, can be calculated based on at least first electric energy output data of the charging pile acquired by the charging module of the charging pile when the external electric meter is in the fault state. That is, the amount of electricity consumed by the charging pile can be calculated even when the external electric meter is in the fault state, so that the controller calculates the cost based on the amount of electricity consumed by the charging pile.

12 Claims, 3 Drawing Sheets

(51) Int. Cl.
  *B60L 53/66*   (2019.01)
  *G01R 22/06*   (2006.01)
  *G06Q 50/06*   (2012.01)
(58) Field of Classification Search
  USPC .......................... 324/74, 73.1, 426, 432–435
  See application file for complete search history.

(56) References Cited

FOREIGN PATENT DOCUMENTS

| | | |
|---|---|---|
| CN | 107330740 A | 11/2017 |
| CN | 208351613 U | 1/2019 |
| CN | 109532545 A | 3/2019 |
| CN | 109784985 A | 5/2019 |
| CN | 111016727 A | 4/2020 |
| CN | 111243186 A | 6/2020 |
| CN | 111845420 A | 10/2020 |

OTHER PUBLICATIONS

Extended European Search Report for European Application No. 22164809.0, dated Sep. 26, 2022.

\* cited by examiner

METHOD AND DEVICE FOR ACQUIRING CHARGING ELECTRICITY AMOUNT, AND ELECTRONIC DEVICE

The present application claims priority to Chinese Patent Application No. 202110499576.7, titled "METHOD AND DEVICE FOR ACQUIRING CHARGING ELECTRICITY AMOUNT, AND ELECTRONIC DEVICE", filed on May 8, 2021 with the China National Intellectual Property Administration, which is incorporated herein by reference in its entirety.

FIELD

The present disclosure relates to the field of charging piles, and in particular to a method and a device for acquiring a charging electricity amount, and an electronic device.

BACKGROUND

With the continuous development of vehicle technology, electric vehicles are increasingly used, and increasing charging piles are arranged on roads for charging the electric vehicles. A charging pile is provided with an external electric meter. When the charging pile charges an electric vehicle, the external electric meter acquires charging information (for example, an amount of electricity consumed for charging the electric vehicle) and transmits the charging information to a controller of the charging pile. The controller calculates a cost based on the charging information.

In a case that the external electric meter fails or communications between the external electric meter and the controller fail, the controller fails to receive the charging information acquired by the external electric meter, and thus fails to calculate the cost.

SUMMARY

In view of this, a method and a device for acquiring a charging electricity amount, and an electronic device are provided according to the present disclosure, so as to solve a technical problem that the controller fails to calculate the cost due to failure to receive the charging information acquired by the external electric meter when the external electric meter fails or communications between the external electric meter and the controller fail.

In order to solve the above technical problem, the following technical solutions are provided according to the present disclosure.

A method for acquiring a charging electricity amount is provided. The method is applied to a controller and the method includes: acquiring electric meter information of an external electric meter in a charging process, Where the electric meter information includes operation state information; and acquiring, in a case of determining based on at least the operation state information that the external electric meter is in a fault state, a first amount of electricity outputted by a charging pile when the external electric meter is in the fault state, until the charging process ends or the external electric meter is in a normal operation state. The first amount of electricity is calculated based on at least first electric energy output data of the charging pile, and the first electric energy output data is acquired by a charging module of the charging pile when the external electric meter is in the fault state.

In an embodiment, the operation state information of the external electric meter is acquired by: transmitting multiple data acquisition instructions to the external electric meter successively; and determining whether the external electric meter transmits, for each of the multiple data acquisition instructions, feedback information in response to the data acquisition instruction, to obtain the operation state information of the external electric meter.

In an embodiment, determining based on at least the operation state information whether the external electric meter is in the fault state includes: determining, in the operation state information, whether a missing case that the feedback information is missed preset times in succession occurs; determining that the external electric meter is in the fault state in a case that the missing case occurs; and determining that the external electric meter is in the normal operation state in a case that the missing case does not occur.

In an embodiment, the electric meter information further includes first charging data acquired by the external electric meter, and determining based on at least the operation state information whether the external electric meter is in the fault state includes: acquiring second electric energy output data of the charging pile acquired by the charging module of the charging pile; calculating a difference in preset data between the first charging data and the second electric energy output data; determining that the external electric meter is in the fault state in a case that the difference is greater than a preset threshold; and determining that the external electric meter is in the normal operation state in a case that the difference is not greater than the preset threshold.

In an embodiment, the acquiring a first amount of electricity outputted by a charging pile when the external electric meter is in the fault state includes: transmitting an electricity amount acquisition instruction to the charging module of the charging pile, where in response to the electricity amount acquisition instruction, the charging module calculates the first amount of electricity, outputted by the charging pile when the external electric meter is in the fault state, based on at least the first electric energy output data of the charging pile acquired when the external electric meter is in the fault state; and receiving the first amount of electricity fed back by the charging module.

In an embodiment, the acquiring a first amount of electricity outputted by a charging pile when the external electric meter is in the fault state includes: transmitting a charging data acquisition instruction to the charging module of the charging pile, where in response to the charging data acquisition instruction, the charging module acquires the first electric energy output data of the charging pile acquired when the external electric meter is in the fault state; receiving the first electric energy output data transmitted by the charging module; and acquiring the first amount of electricity based on at least the first electric energy output data.

In an embodiment, acquiring the first amount of electricity based on at least the first electric energy output data includes: calculating an initial amount of electricity based on the first electric energy output data; acquiring a compensation value, where the compensation value corresponds to a charging power interval including a charging power of the charging pile and varies with the charging power interval; and calculating a sum of the initial amount of electricity and the compensation value, as the first amount of electricity.

In an embodiment, the compensation value corresponding to the charging power interval is acquired by: acquiring, for each time in a process that the charging pile performs charging at a charging power in the charging power interval multiple times, a first charging electricity amount calculated based on electric energy output data of the charging pile, and a second charging electricity amount acquired based on charging data acquired by the external electric meter; calculating, for each time ler charging, a difference between the first charging electricity amount and the second charging electricity amount; and calculating a ratio of a sum, of the differences for the multiple times for charging, to the number of times for charging, as the compensation value corresponding to the charging power interval.

In an embodiment, the method further includes: acquiring, in a case of determining based on at least the operation state information that the external electric meter is in the normal operation state, a second amount of electricity based on second charging data acquired by the external electric meter, where the second amount of electricity is outputted by the charging pile when the external electric meter is in the normal operation state.

In an embodiment, the method further includes: acquiring, after the charging process ends, all the first amount of electricity and all the second amount of electricity in the charging process; and calculating a sum of all the first amount of electricity and all the second amount of electricity, as a total charging electricity amount in the charging process.

A device for acquiring a charging electricity amount is provided. The device is applied to a controller and the device includes: an information acquiring module configured to acquire electric meter information of an external electric meter in a charging process, where the electric meter information includes operation state information; and an electricity amount calculation module configured to acquire, in a case of determining based on at least the operation state information that the external electric meter is in a fault state, a first amount of electricity outputted by a charging pile when the external electric meter is in the fault state, until the charging process ends or the external electric meter is in a normal operation state. The first amount of electricity is calculated based on at least first electric energy output data of the charging pile, and the first electric energy output data is acquired by a charging module of the charging pile when the external electric meter is in the fault state.

A storage medium is provided. The storage medium stores a program. The program, when running, controls a device including the storage medium to perform the method for acquiring a charging electricity amount described above.

An electronic device is provided. The electronic device includes: a memory configured to store a program; and a processor configured to invoke the program to perform the method for acquiring a charging electricity amount described above.

Compared with the conventional technology, the present disclosure has the following beneficial effects. A method for acquiring a charging electricity amount is provided according to the present disclosure. When the controller determines based on at least operation state information of the external electric meter that the external electric meter is in the fault state, the first amount of electricity, outputted by the charging pile when the external electric meter is in the fault state, can be calculated based on at least first electric energy output data of the charging pile acquired by the charging module of the charging pile when the external electric meter is in the fault state. That is, in the present disclosure, the amount of electricity consumed by the charging pile can be calculated even when the external electric meter is in the fault state, so that the controller calculates the cost based on the amount of electricity consumed by the charging pile.

BRIEF DESCRIPTION OF THE DRAWINGS

In order to more clearly illustrate technical solutions in embodiments of the present disclosure or in the conventional technology, the drawings to be used in the description of the embodiments or the conventional technology are briefly described below. It is apparent that the drawings in the following description show only some embodiments of the present disclosure, and other drawings may be obtained by those skilled in the art from the provided drawings without any creative work.

DETAILED DESCRIPTION OF EMBODIMENTS

The technical solutions in the embodiments of the present disclosure are described clearly and completely in conjunction with the drawings in the embodiments of the present disclosure hereinafter. It is apparent that the described embodiments are only some rather than all embodiments of the present disclosure. All other embodiments obtained by those skilled in the art based on the embodiments of the present disclosure without any creative work fall within the protection scope of the present disclosure.

With the continuous development of vehicle technology, electric vehicles are increasingly used, and increasing charging piles are arranged on roads for charging the electric vehicles. A charging pile is provided with an external electric meter. When the charging pile charges an electric vehicle, the external electric meter acquires charging information (for example, an amount of electricity consumed for charging the electric vehicle) and transmits the charging information to a controller of the charging pile. The controller calculates the cost based on the charging information.

In a case that the external electric meter fails or communications between the external electric meter and the controller fail, the controller fails to receive the charging information acquired by the external electric meter, and thus fails to calculate the cost.

A charging pile outputs a current when charging an electric vehicle. A charging module of the charging pile is capable of acquiring a voltage and the current outputted by the charging pile when charging the electric vehicle. Therefore, in the case that the external electric meter fails or communications between the external electric meter and the controller fail, the charging module acquires the voltage and the current outputted by the charging pile, and an electricity amount is calculated based on the voltage and the current. The electricity amount is an amount of electricity consumed by the charging pile in the case that the external electric meter fails or communications between the external electric meter and the controller fail.

When a controller determines based on at least operation state information of the external electric meter that the external electric meter is in a fault state, a first amount of electricity, outputted by the charging pile when the external electric meter is in the fault state, can be calculated based on at least first electric energy output data of the charging pile acquired by the charging module of the charging pile when the external electric meter is in the fault state. That is, in the present disclosure, the amount of electricity consumed by the charging pile can be calculated even when the external electric meter is in the fault state, so that the controller calculates the cost based on the amount of electricity consumed by the charging pile.

Based on the foregoing, a method for acquiring a charging electricity amount is provided according to an embodiment of the present disclosure. The method is applied to a controller. The controller in the present embodiment refers to a main controller of a charging pile.

Figure 1:
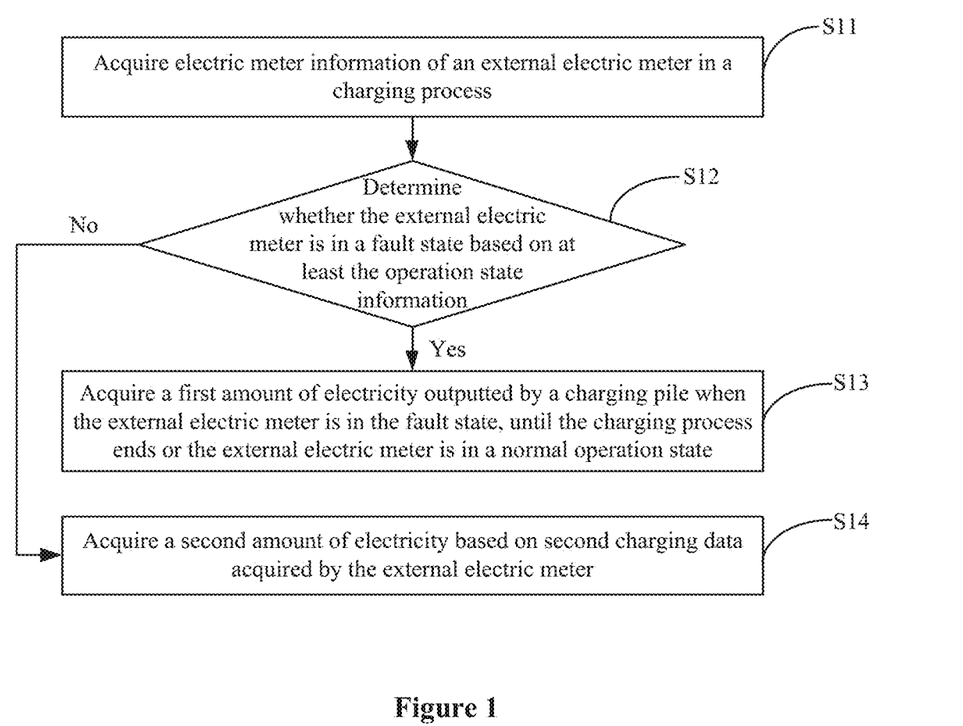
FIG. 1 is a flowchart showing a method for acquiring a charging electricity amount according to an embodiment of the present disclosure.

Referring to FIG. 1, the method for acquiring a charging electricity amount includes the following steps S11 to S14.

In step S11, acquire electric meter information of an external electric meter in a charging process. The electric meter information includes operation state information.

In practice, in order to charge an electric vehicle, a charging gun of the charging pile is connected to a charging port of the electric vehicle and a start charging button is pressed, so that the charging pile charges the electric vehicle. The charging process in the present embodiment refers to a time period from a time instant when the charging gun of the charging pile is connected to the charging port of the electric vehicle to a time instant when the charging gun of the charging pile is disconnected from the charging port of the electric vehicle.

The charging pile is provided with an external electric meter. The external electric meter acquires charging data in the charging process, for example, a charging voltage and a charging current, and transmits the charging voltage and the charging current to the controller. The controller calculates an electricity consumption amount in the charging process based on the charging voltage and the charging current, so as to calculate the cost.

Alternatively, the external electric meter calculates the electricity consumption amount in the charging process based on the charging voltage and the charging current, and transmits charging data, for example, the charging voltage, the charging current, and the electricity consumption amount to the controller. After the charging process ends, the controller calculates the cost based on the electricity consumption amount.

The external electric meter communicates with the controller based on a heartbeat communication mechanism. The controller transmits heartbeat information at preset intervals, for example, 20 ms. The heartbeat information may include a data acquisition instruction for acquiring the charging data. When receiving the heartbeat information, the external electric meter transmits the charging data acquired in real time to the controller.

In this embodiment, the electric meter information of the external electric meter is acquired in the charging process. The electric meter information includes operation state information. In this embodiment, the operation state information includes a determination result of whether the external electric meter transmits, for each data acquisition instruction, feedback information in response to the data acquisition instruction.

The operation state information of the external electric meter is acquired by performing the following steps 1) to 2). 1) Multiple data acquisition instructions are transmitted to the external electric meter successively. 2) It is determined whether the external electric meter transmits, for each of the multiple data acquisition instructions, feedback information in response to the data acquisition instruction, to obtain the operation state information of the external electric meter.

In practice, the controller transmits the heartbeat information, that is, the data acquisition instruction to the external electric meter at preset intervals, and receives, for each data acquisition instruction, the feedback information transmitted by the external electric meter in response to the data acquisition instruction. In the case that the external electric meter is in a normal operation state (that is, the external electric meter does not fail and the communications between the external electric meter and the controller does not fail), the external electric meter successfully transmits feedback information. However, in a case that the external electric meter is in the fault state (that is, the external electric meter fails, or the communications between the external electric meter and the controller fail), the external electric meter transmits feedback information unsuccessfully. In this case, the controller receives no feedback information.

In this embodiment, the determination result of whether the external electric meter transmits feedback information in response to each data acquisition instruction serves as the operation state information of the external electric meter.

In step S12, determine whether the external electric meter is in the fault state based on at least the operation state information. Step S13 is performed when it is determined that the external electric meter is in the fault state. Step S14 is performed when it is determined that the external electric meter is in the normal operation state.

In this embodiment, there are two solutions for determining whether the external electric meter is in the fault state. The fault state in this embodiment includes that the external electric meter itself fails, or the communications between the external electric meter and the controller fail. The two solutions are described as follows.

1. First Solution

In this solution, determine, in the operation state information, whether a missing case that the feedback information is missed preset times in succession occurs; determine that the external electric meter is in the fault state in a case that the missing case occurs; and determine that the external electric meter is in the normal operation state in a case that the missing case does not occur.

If the feedback information from the external electric meter is missed multiple times in succession, for example, three times in succession, it is determined that the communications between the external electric meter and the controller fail. In this case, the electricity consumption amount cannot be acquired based on feedback information from the external electric meter, and the external electric meter is determined as being in the fault state.

If the feedback information is successfully received each time, or is missed for only one time, the external electric meter is determined as being in the normal operation state.

In this solution, whether the external electric meter is in the fault state is determined by determining whether the feedback information from the external electric meter is received successfully. That is, whether the external electric meter is in the fault state is determined by determining whether the communications between the external electric meter and the controller fail. In addition, whether the external electric meter fails is determined by determining whether data acquired by the external electric meter is correct.

In another embodiment of the present disclosure, the electric meter information further includes first charging data. The first charging data is acquired by the external electric meter.

The first charging data includes current data and voltage data of a circuit in which the external electric meter is arranged.

2. Second Solution

Figure 2:
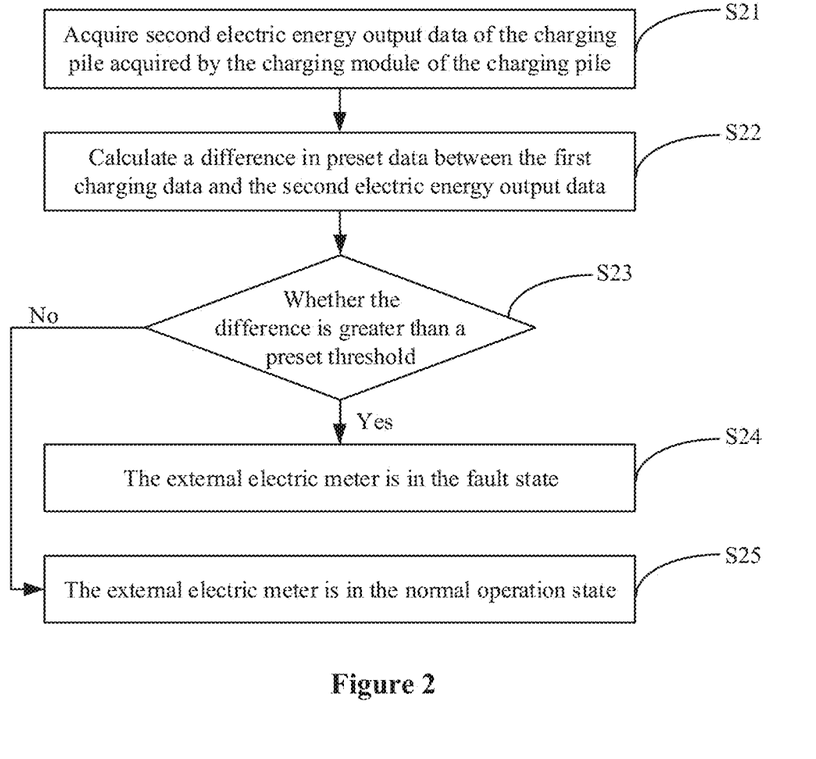
FIG. 2 is a flowchart showing a method for acquiring a charging electricity amount according to another embodiment of the present disclosure.

Referring to FIG. 2, step S12 includes the following steps S21 to S25.

In step S21, acquire second electric energy output data of the charging pile acquired by the charging module of the charging pile.

In practice, the charging module of the charging pile acquires the voltage and the current outputted by the charging pile in real time. The second electric energy output data in this embodiment includes the voltage and the current.

In step S22, calculate a difference in preset data between the first charging data and the second electric energy output data.

In practice, if the external electric meter normally acquires data, the voltage or current acquired by the charging module approximates the voltage or current acquired by the external electric meter. Therefore, in this embodiment, whether the external electric meter is in the normal operation state, that is, whether the external electric meter normally acquires data is determined by comparing whether the voltage or current acquired by the external electric meter approximates the voltage or current acquired by the charging module.

The preset data in this embodiment is voltage data or current data.

In an example, the preset data is current data. Therefore, a difference between the current in the first charging data and the current in the second electric energy output data is calculated.

In step S23, determine whether the difference is greater than a preset threshold. Step S24 is performed when determining that the difference is greater than the preset threshold. Step S25 is performed when determining that the difference is not greater than the preset threshold.

In step S24, determine that the external electric meter is in the fault state.

In step S25, determine that the external electric meter is in the normal operation state.

The preset threshold is set by the technician depending on application scenarios. If the difference is greater than the preset threshold, it indicates that the data acquired by the charging module of the charging pile differs greatly from the data acquired by the external electric meter, the external electric meter acquires data abnormally. That is, the external electric meter is in the fault state. If the difference is not greater than the preset threshold, it indicates that the data acquired by the charging module of the charging pile differs slightly from the data acquired by the external electric meter, the external electric meter acquires data normally. That is, the external electric meter is in the normal operation state. It should be noted that a prerequisite for determining whether the data acquired by the charging module differs greatly from the data acquired by the external electric meter in this embodiment is that the charging module is in the normal operation state. Only when the charging module acquires data normally, the data acquired by the charging module can be used for reference.

In step S13, acquire a first amount of electricity outputted by a charging pile when the external electric meter is in the fault state, until the charging process ends or the external electric meter is in a normal operation state.

The first amount of electricity is calculated based on at least first electric energy output data of the charging pile. The first electric energy output data is acquired by the charging module of the charging pile when the external electric meter is in the fault state. The charging module in this embodiment is a front-stage power factor correction (PFC) module or a rear-stage resonant circuit (LLC) module in the charging module.

In practice, when the external electric meter is in the fault state, the amount of electricity outputted by the charging pile is calculated based on the first electric energy output data of the charging pile acquired by the charging module of the charging pile when the external electric meter is in the fault state.

In another embodiment of the present disclosure, the first amount of electricity may be calculated by the controller based on the first electric energy output data, or calculated by the charging module based on the first electric energy output data and then transmitted to the controller, which are described as follows.

1. In a first case, the first amount of electricity is calculated by the controller based on the first electric energy output data.

Figure 3:
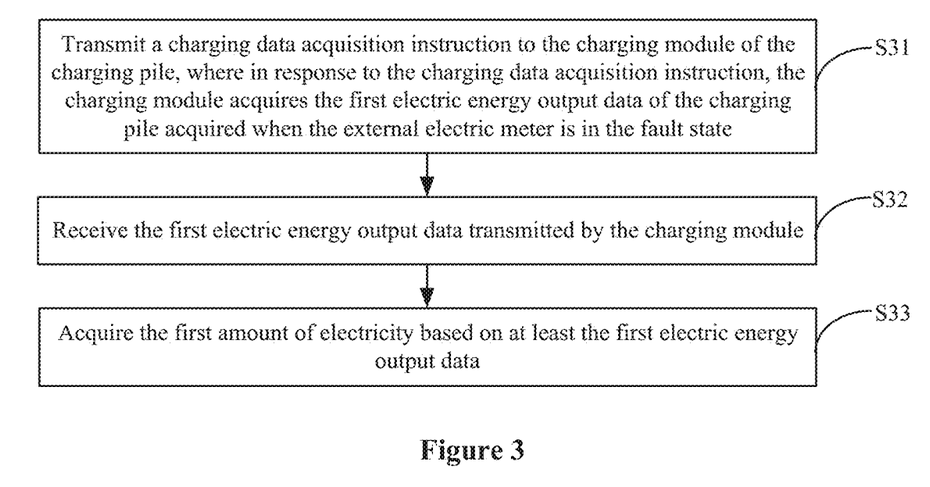
FIG. 3 is a flowchart showing a method for acquiring a charging electricity amount according to another embodiment of the present disclosure.

Referring to FIG. 3, step S13 includes the following steps S31 to S33.

In step S31, transmit a charging data acquisition instruction to the charging module of the charging pile. In response to the charging data acquisition instruction, the charging module acquires the first electric energy output data of the charging pile acquired when the external electric meter is in the fault state.

In practice, the charging module acquires electric energy output data of the charging pile when the charging process stalls, or acquires the electric energy output data of the charging pile in response to the charging data acquisition instruction transmitted by the controller. Data outputted by the charging pile when the external electric meter is in the fault state is the first electric energy output data. The first electric energy output data includes a voltage and a current in various time periods (for example, 10 ms).

In step S32, receive the first electric energy output data transmitted by the charging module.

The charging module transmits the data acquired in various time periods to the controller.

In step S33, acquire the first amount of electricity based on at least the first electric energy output data.

In practice, the first amount of electricity is calculated according to an equation $W_i = U_i I_i T_i$. In this equation, $W_i$ represents an amount of electricity in an $i^{th}$ time period. $U_i$ represents a voltage in the time period. $I_i$ represents a current in the time period. $T_i$ represents the $i^{th}$ time period. After the amount of electricity $W_i$ is calculated, a sum of the amount of electricity $W_i$ in all time periods is the first amount of electricity according to the present embodiment.

In practice, since a position of the charging module is different from a position of the external electric meter, the data acquired by the charging module may be different from the data acquired by the external electric meter. Therefore, the first amount of electricity calculated in step S33 may have an error. In this embodiment, the error is corrected by compensation.

Figure 4:
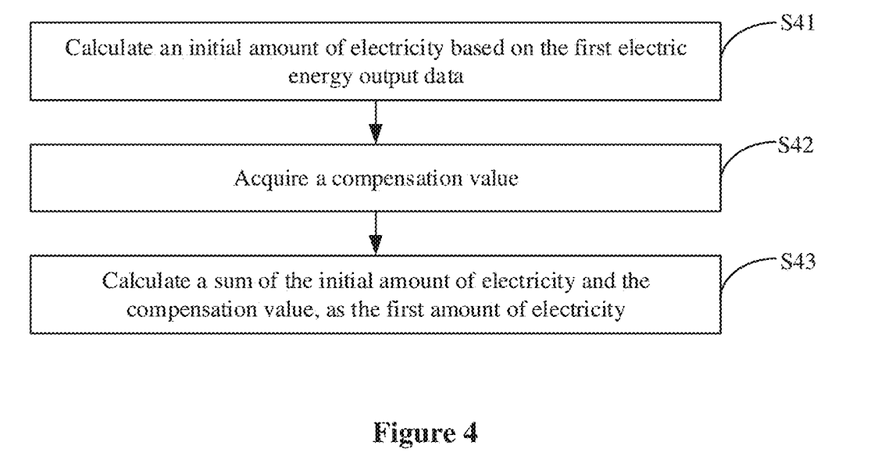
FIG. 4 is a flowchart showing a method for acquiring a charging electricity amount according to another embodiment of the present disclosure.

Referring to FIG. 4, step S33 includes the following steps S41 to S43.

In step S41, calculate an initial amount of electricity based on the first electric energy output data.

The initial amount of electricity is the sum of the amount of electricity $W_i$ in all time periods as described above.

In step S42, acquire a compensation value.

The compensation value corresponds to a charging power interval including a charging power of the charging pile, and varies with the charging power interval.

In practice, a correspondence between the compensation values and the charging power intervals of the charging pile is preset, and is stored in a storage unit in the controller, as shown in Table 1. In this embodiment, the charging module acquires the charging power of the charging pile, and transmits the charging power to the controller. The controller acquires a compensation value corresponding to a charging power interval including the received charging power according to Table 1. Alternatively, the charging module acquires the charging power of the charging pile, acquires a compensation value corresponding to a charging power interval including the acquired charging power according to Table 1, and transmits the acquired compensation value to the controller.

TABLE 1

| Charging power interval | Compensation value |
|---|---|
| 0-0.2 PN | 1 |
| 0.2-0.4 PN | 2 |
| 0.4-0.6 PN | 3 |
| 0.6-0.8 PN | 4 |
| 0.8-1.0 PN | 5 |

The compensation value varies with the charging power interval, so that an accuracy of the calculated amount of electricity is improved.

In another embodiment of the present disclosure, a compensation value corresponding to a charging power interval is acquired by performing the following steps 1) to 3).

In step 1), acquire, for each time in a process that the charging pile performs charging at a charging power in the charging power interval multiple times, a first charging electricity amount calculated based on electric energy output data of the charging pile, and a second charging electricity amount acquired based on charging data acquired by the external electric meter.

In a case that the charging pile performs charging normally and the external electric meter operates normally, the charging pile performs charging at a charging power in a charging power interval, and the first charging electricity amount calculated based on the electric energy output data of the charging pile (as shown in the above description) and the second charging electricity amount acquired based on the charging data acquired by the external electric meter are acquired periodically.

In step 2), calculate, for each time for charging, a difference between the first charging electricity amount and the second charging electricity amount.

In practice, one difference is acquired by performing charging for one time. Therefore, multiple differences are acquired by performing charging multiple times.

In step 3), calculate a ratio of a sum, of the differences for the multiple times for charging, to the number of times for charging, as the compensation value corresponding to the charging power interval.

In a case that the number of differences is greater than a set number N, a compensation value Kx is calculated and stored in the storage unit.

$$Kx=(\Delta W1+\Delta W2+\Delta W3+ \ldots +\Delta WN)/N.$$

$\Delta WN$ represents an $N^{th}$ difference.

It should be noted that Kx may be a positive number or a negative number.

In step S43, calculate a sum of the initial amount of electricity and the compensation value, as the first amount of electricity.

The first amount of electricity is calculated from an equation $W_{charging}=W_{LLC}+Kx$. $W_{charging}$ represents the first amount of electricity $W_{LLC}$ represents the initial amount of electricity. Kx represents the compensation value.

2. in a second case, the first amount of electricity is calculated by the charging module of the charging pile based on the first electric energy output data.

Step S13 includes the following steps 1) to 2).

In step 1), transmit an electricity amount acquisition instruction to the charging module of the charging pile. In response to the electricity amount acquisition instruction, the charging module calculates the first amount of electricity, outputted by the charging pile when the external electric meter is in the fault state, based on at least the first electric energy output data of the charging pile acquired when the external electric meter is in the fault state.

In step 2), receive the first amount of electricity fed back by the charging module.

This embodiment is different from the above embodiment in that, the charging module calculates the first amount of electricity and transmits the calculated first amount of electricity to the controller in this embodiment. In the above embodiment, the charging module transmits the data for calculating the first amount of electricity to the controller, and the controller calculates the first amount of electricity.

In this embodiment, the first amount of electricity is calculated in a similar process as that in the above embodiment. In this embodiment, if the charging module calculates the first amount of electricity, the correspondence between the compensation values and the charging power intervals of the charging pile as described above is stored in the charging to module, and the correspondence is acquired by the charging module from calculation.

The first electric energy output data of the charging pile when the external electric meter is in the fault state is calculated as described above. It should be noted that when the external electric meter operates normally or when the charging process ends, the process, of calculating the charging electricity amount based on the first electric energy output data of the charging pile acquired by the charging module when the external electric meter is in the fault state, ends.

In step S14, acquired a second amount of electricity based on second charging data acquired by the external electric meter. The second amount of electricity is outputted by the charging pile when the external electric meter is in the normal operation state.

If it is determined based on at least the operation state information that the external electric meter is in the normal operation state, the amount of electricity for charging is calculated based on data acquired by the external electric meter.

It should be noted that after the external electric meter resumes normal operation in the charging process, the data fed back by the external electric meter includes the current, the voltage and the amount of electricity for charging when the external electric meter is in the normal operation state. That is, the amount of electricity for charging in a time period during which the external electric meter is in the normal operation state and the amount of electricity for charging in a time period during which the external electric meter is in the fault state both can be calculated.

In another embodiment of the present disclosure, after the charging process ends, the method further includes: acquiring all the first amount of electricity and all the second amount of electricity in the charging process; and calculating a sum of all the first amount of electricity and all the second amount of electricity, as a total charging electricity amount in the charging process.

Throughout the charging process, the external electric meter may be in the fault state multiple times. Therefore, the charging process includes at least a time period during which the external electric meter is in the normal operation state and a time period during which the external electric meter is in the fault state. The time period during which the external electric meter is in the normal operation state corresponds to the second amount of electricity. The time period during which the external electric meter is in the fault state corresponds to the first amount of electricity. The total charging electricity amount in the charging process is calculated by adding all the first amount of electricity and all the second amount of electricity in the charging process.

It should be noted that the external electric meter may be in the normal operation state throughout the charging process. In this case, the total charging electricity amount in the charging process is equal to the second amount of electricity, with no first amount of electricity.

Alternatively, the external electric meter may be in the fault state throughout the charging process. In this case, the total total charging electricity amount in the charging process is equal to the first amount of electricity, with no second amount of electricity.

In this embodiment, when the controller determines based on at least operation state information of the external electric meter that the external electric meter is in the fault state, the first amount of electricity, outputted by the charging pile when the external electric meter is in the fault state, can be calculated based on at least first electric energy output data of the charging pile acquired by the charging module of the charging pile when the external electric meter is in the fault state. That is, in the present disclosure, the amount of electricity consumed by the charging pile can be calculated even when the external electric meter is in the fault state, so that the controller calculates the cost based on the amount of electricity consumed by the charging pile.

In addition, in the present disclosure, it is unnecessary to add an external device when the external electric meter is in the fault state. The electricity consumption for charging is calculated by the charging module even when the external electric meter is in the fault state, without additional cost.

In addition, compensation in introduced to make the amount of electricity calculated based on the data acquired by the charging module be slightly different from the amount of electricity acquired based on data acquired by the external electric meter, so that the amount of electricity calculated based on the data acquired by the charging module replace the amount of electricity acquired based on data acquired by the external electric meter.

Figure 5:
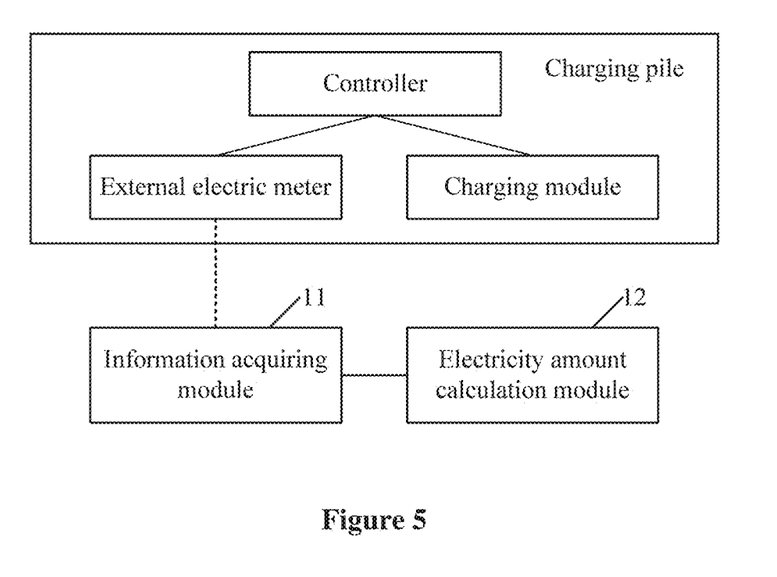
FIG. 5 is a schematic structural diagram showing a device for acquiring a charging electricity amount according to an embodiment of the present disclosure.

Based on the above embodiments of the method for acquiring a charging electricity amount, a device for acquiring a charging electricity amount is provided according to another embodiment of the present disclosure. The device is applied to a controller. Referring to FIG. 5, the device includes an information acquiring module 11 and an electricity amount calculation module 12. The information acquiring module 11 is configured to acquire electric meter information of an external electric meter in a charging process. The electric meter information includes operation state information. The electricity amount calculation module 12 is configured to acquire, in a case of determining based on at least the operation state information that the external electric meter is in a fault state, a first amount of electricity outputted by a charging pile when the external electric meter is in the fault state, until the charging process ends or the external electric meter is in a normal operation state. The first amount of electricity is calculated based on at least first electric energy output data of the charging pile, and the first electric energy output data is acquired by a charging module of the charging pile when the external electric meter is in the fault state.

Furthermore, the information acquiring module 11 is configured to: transmit multiple data acquisition instructions to the external electric meter successively and determine whether the external electric meter transmits, for each of the multiple data acquisition instructions, feedback information in response to the data acquisition instruction, to obtain the operation state information of the external electric meter.

Furthermore, in order to determine, based on at least the operation state information, whether the external electric meter is in the fault state, the electricity amount calculation module 12 is configured to: determine, in the operation state information, whether a missing case that the feedback information is missed preset times in succession occurs; determine that the external electric meter is in the fault state in a case that the missing case occurs; and determine that the external electric meter is in the normal operation state in a case that the missing case does not occur.

Furthermore, the electric meter information further includes first charging data acquired by the external electric meter, in order to determine based on at least the operation state information whether the external electric meter is in the fault state, the electricity amount calculation module 12 is configured to: acquire second electric energy output data of the charging pile acquired by the charging module of the charging pile; calculate a difference in preset data between the first charging data and the second electric energy output data; determine that the external electric meter is in the fault state in a case that the difference is greater than a preset threshold; and determine that the external electric meter is in the normal operation state in a case that the difference is not greater than the preset threshold.

Furthermore, the electricity amount calculation module 12 includes: a first instruction transmitting sub-module configured to transmit an electricity amount acquisition instruction to the charging module of the charging pile, where in response to the electricity amount acquisition instruction, the charging module calculates the first amount of electricity, outputted by the charging pile when the external electric meter is in the fault state, based on at least the first electric energy output data of the charging pile acquired when the external electric meter is in the fault state; and an electricity amount receiving sub-module configured to receive the first amount of electricity fed back by the charging module.

Furthermore, the electricity amount calculation module 12 includes: a second instruction transmitting sub-module configured to transmit a charging data acquisition instruction to the charging module of the charging pile, where in response to the charging data acquisition instruction, the charging module acquires the first electric energy output data of the charging pile acquired when the external electric meter is in the fault state; a data receiving sub-module configured to receive the first electric energy output data transmitted by the charging module; and an electricity amount acquiring sub-module configured to acquire the first amount of electricity based on at least the first electric energy output data.

Furthermore, the electricity amount acquiring sub-module includes: a first electricity amount calculating unit configured to calculate an initial amount of electricity based on the first electric energy output data; a compensation value acquiring unit configured to acquire a compensation value, where the compensation value corresponds to a charging power interval including a charging power of the charging pile and varies with the charging power interval; and a second electricity amount calculating unit configured to calculate a sum of the initial amount of electricity and the compensation value, as the first amount of electricity.

Furthermore, the device further includes a compensation acquiring unit configured to: acquire, for each time in a process that the charging pile performs charging at a charging power in the charging power interval multiple times, a first charging electricity amount calculated based on electric energy output data of the charging pile, and a second charging electricity amount acquired based on charging data acquired by the external electric meter; calculate, for each time for charging, a difference between the first charging electricity amount and the second charging electricity amount; and calculate a ratio of a sum, of the differences for the multiple times for charging, to the number of times for charging, as the compensation value corresponding to the charging power interval.

Furthermore, the device further includes an electricity amount acquiring module configured to acquire, in a case of determining based on at least the operation state information that the external electric meter is in the normal operation state, a second amount of electricity based on second charging data acquired by the external electric meter, where the second amount of electricity is outputted by the charging pile when the external electric meter is in the normal operation state.

Furthermore, the device further includes a charging electricity amount acquiring module configured to acquire, after the charging process ends, all the first amount of electricity and all the second amount of electricity in the charging process; and calculate a sum of all the first amount of electricity and all the second amount of electricity, as a total charging electricity amount in the charging process.

In this embodiment, when the controller determines based on at least operation state information of the external electric meter that the external electric meter is in the fault state, the first amount of electricity, outputted by the charging pile when the external electric meter is in the fault state, can be calculated based on at least first electric energy output data of the charging pile acquired by the charging module of the charging pile when the external electric meter is in the fault state. That is, in the present disclosure, the amount of electricity consumed by the charging pile can be calculated even when the external electric meter is in the fault state, so that the controller calculates the cost based on the amount of electricity consumed by the charging pile.

In addition, in the present disclosure, it is unnecessary to add an external device when the external electric meter is in the fault state. The electricity consumption for charging is calculated by the charging module even when the external electric meter is in the fault state, without additional cost.

In addition, compensation in introduced to make the amount of electricity calculated based on the data acquired by the charging module be slightly different from the amount of electricity acquired based on data acquired by the external electric meter, so that the amount of electricity calculated based on the data acquired by the charging module replace the amount of electricity acquired based on data acquired by the external electric meter.

It should be noted that, operations of each module, sub-module, and unit in this embodiment can refer to the corresponding description in the above embodiments, and are not described in detail here.

Based on the above embodiments of the method and the device for acquiring a charging electricity amount, a storage medium is provided according to another embodiment of the present disclosure. The storage medium stores a program. The program, when running, controls a device including the storage medium to perform the method for acquiring a charging electricity amount described above.

Based on the above embodiments of the method and the device for acquiring a charging electricity amount, an electronic device is provided according to another embodiment of the present disclosure. The electronic device includes: a memory configured to store a program; and a processor configured to invoke the program to perform the method for acquiring a charging electricity amount described above.

Based on the above description of the disclosed embodiments, those skilled in the art can implement or carry out the present disclosure. Those skilled in the art can easily think of various modifications to the disclosed embodiments, and the general principles defined herein may be implemented in other embodiments without departing from the spirit or scope of the present disclosure. Therefore, the present disclosure should not be limited to the embodiments described herein, but conforms to the widest scope that complies with the principles and novelty disclosed herein.

The invention claimed is:

1. A method for acquiring a charging electricity amount, the method being applied to a charging pile, the charging pile comprising an external electric meter, a charging module and a controller, the external electric meter and the charging module being electrically connected to the controller respectively, and the method comprising:
   acquiring, by the controller, electric meter information of]the external electric meter in a charging process, wherein the electric meter information comprises operation state information;
   acquiring, by the controller determining based on at least the operation state information that the external electric meter is in a fault state, a first amount of electricity outputted by the charging pile when the external electric meter is in the fault state, until the charging process ends or the external electric meter is in a normal operation state;
   determining a total charging electricity amount in the charging process based on the first amount of electricity; and
   calculating, by the controller, a cost based on the total charging electricity amount;
   wherein the first amount of electricity is calculated based on at least first electric energy output data of the charging pile, and the first electric energy output data is acquired by the charging module of the charging pile when the external electric meter is in the fault state; and
   wherein the acquiring the first amount of electricity comprises:

calculating, by the controller or the charging module, an initial amount of electricity based on the first electric energy output data;

acquiring, by the controller or the charging module, a compensation value, wherein the compensation value corresponds to a charging power interval comprising a charging power of the charging pile and varies with the charging power interval; and calculating, by the controller or the charging module, a sum of the initial amount of electricity and the compensation value, as the first amount of electricity.

2. The method according to claim 1, wherein the operation state information of the external electric meter is acquired by:

transmitting a plurality of data acquisition instructions to the external electric meter successively; and determining whether the external electric meter transmits, for each of the plurality of data acquisition instructions, feedback information in response to the data acquisition instruction, to obtain the operation state information of the external electric meter.

3. The method according to claim 2, wherein determining based on at least the operation state information whether the external electric meter is in the fault state comprises:

determining, in the operation state information, whether a missing case that the feedback information is missed preset times in succession occurs;

determining that the external electric meter is in the fault state in a case that the missing case occurs; and determining that the external electric meter is in the normal operation state in a case that the missing case does not occur.

4. The method according to claim 1, wherein the electric meter information further comprises first charging data acquired by the external electric meter, and determining based on at least the operation state information whether the external electric meter is in the fault state comprises:

acquiring second electric energy output data of the charging pile acquired by the charging module of the charging pile;

calculating a difference in preset data between the first charging data and the second electric energy output data;

determining that the external electric meter is in the fault state in a case that the difference is greater than a preset threshold; and determining that the external electric meter is in the normal operation state in a case that the difference is not greater than the preset threshold.

5. The method according to claim 1, wherein the acquiring a first amount of electricity outputted by the charging pile when the external electric meter is in the fault state comprises:

transmitting an electricity amount acquisition instruction to the charging module of the charging pile, wherein in response to the electricity amount acquisition instruction, the charging module calculates the first amount of electricity, outputted by the charging pile when the external electric meter is in the fault state, based on at least the first electric energy output data of the charging pile acquired when the external electric meter is in the fault state; and receiving the first amount of electricity fed back by the charging module.

6. The method according to claim 1, wherein in a case of determining based on at least the operation state information that the external electric meter is in the fault state, the method further comprises:

transmitting a charging data acquisition instruction to the charging module of the charging pile, wherein in response to the charging data acquisition instruction, the charging module acquires the first electric energy output data of the charging pile acquired when the external electric meter is in the fault state; and receiving the first electric energy output data transmitted by the charging module.

7. The method according to claim 1, wherein the compensation value corresponding to the charging power interval is acquired by:

acquiring, for each time in a process that the charging pile performs charging at a charging power in the charging power interval a plurality of times, a first charging electricity amount calculated based on electric energy output data of the charging pile, and a second charging electricity amount acquired based on charging data acquired by the external electric meter;

calculating, for each time for charging, a difference between the first charging electricity amount and the second charging electricity amount; and calculating a ratio of a sum, of the differences for the plurality of times for charging, to the number of times for charging, as the compensation value corresponding to the charging power interval.

8. The method according to claim 1, in a case of determining based on at least the operation state information that the external electric meter is in the fault state, the method further comprises:

acquiring, in a case of determining based on at least the operation state information that the external electric meter is in the normal operation state, a second amount of electricity based on second charging data acquired by the external electric meter, wherein the second amount of electricity is outputted by the charging pile when the external electric meter is in the normal operation state.

9. The method according to claim 8, after the charging process ends, the method further comprising:

acquiring all the first amount of electricity and all the second amount of electricity in the charging process; and calculating the sum of all the first amount of electricity and all the second amount of electricity, as a total charging electricity amount in the charging process.

10. A storage medium storing a program, wherein the program, when running, controls a device comprising the storage medium to perform the method for acquiring a charging electricity amount according to claim 1.

11. An electronic device, comprising:

a memory configured to store a program; and a processor configured to invoke the program to perform the method for acquiring a charging electricity amount according to claim 1.

12. A device for acquiring a charging electricity amount, the device being applied to a charging pile, the charging pile comprising an external electric meter, a charging module and a controller, the external electric meter and the charging module being electrically connected to the controller respectively, and the device comprising:

an information acquiring module configured to acquire electric meter information of the external electric meter in a charging process, wherein the electric meter information comprises operation state information; and an electricity amount calculation module configured to:
acquire, in a case of determining based on at least the operation state information that the external electric meter is in a fault state, a first amount of electricity outputted by the charging pile when the external electric meter is in the fault state, until the charging process ends or the external electric meter is in a normal operation state; determine a total charging electricity amount in the charging process based on the first amount of electricity; and calculate a cost based on the total charging electricity amount;

wherein the first amount of electricity is calculated based on at least first electric energy output data of the charging pile, and the first electric energy output data is acquired by the charging module of the charging pile when the external electric meter is in the fault state; and wherein the electricity amount calculation module is further configured to:

calculate an initial amount of electricity based on the first electric energy output data;

acquire a compensation value, wherein the compensation value corresponds to a charging power interval comprising a charging power of the charging pile and varies with the charging power interval; and calculate a sum of the initial amount of electricity and the compensation value, as the first amount of electricity.

\* \* \* \* \*

UNITED STATES PATENT AND TRADEMARK OFFICE
CERTIFICATE OF CORRECTION

PATENT NO. : 11,831,184 B2
APPLICATION NO. : 17/718718
DATED : November 28, 2023
INVENTOR(S) : Xingfeng Shui et al.

It is certified that error appears in the above-identified patent and that said Letters Patent is hereby corrected as shown below:

In the Claims

At Column 17, Claim 12, Line 4:
"acquire, in a case of determining"
Should read:
-- acquire, determining --

Signed and Sealed this
Thirteenth Day of February, 2024

Katherine Kelly Vidal
*Director of the United States Patent and Trademark Office*